(12) United States Patent
Benzel et al.

(10) Patent No.: US 7,833,405 B2
(45) Date of Patent: Nov. 16, 2010

(54) MICROMECHANICAL COMPONENT AND CORRESPONDING PRODUCTION METHOD

(75) Inventors: Hubert Benzel, Pliezhausen (DE); Heribert Weber, Nuertingen (DE); Hans Artmann, Magstadt (DE); Frank Schaeffer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 213 days.

(21) Appl. No.: 10/450,362

(22) PCT Filed: Dec. 13, 2001

(86) PCT No.: PCT/DE01/04692

§ 371 (c)(1), (2), (4) Date: Nov. 12, 2003

(87) PCT Pub. No.: WO02/051742

PCT Pub. Date: Jul. 4, 2002

(65) Prior Publication Data

US 2004/0080004 A1 Apr. 29, 2004

(30) Foreign Application Priority Data

Dec. 23, 2000 (DE) .................. 100 65 026

(51) Int. Cl.
| | |
|---|---|
| B23H 3/00 | (2006.01) |
| C23F 1/00 | (2006.01) |
| B31D 3/00 | (2006.01) |
| C03C 25/68 | (2006.01) |
| H01L 21/00 | (2006.01) |

(52) U.S. Cl. .................. 205/640; 216/2; 216/56; 216/87; 216/99; 438/50; 438/53

(58) Field of Classification Search .......... 205/640; 438/50, 53; 216/2, 56, 87, 99
See application file for complete search history.

(56) References Cited

U.S. PATENT DOCUMENTS

| 3,968,565 | A | * | 7/1976 | Bertens et al. ............... 438/3 |
| 4,016,017 | A | * | 4/1977 | Aboaf et al. ............... 438/441 |
| 4,211,888 | A | * | 7/1980 | Stein et al. ............... 136/225 |

(Continued)

FOREIGN PATENT DOCUMENTS

DE      39 23 595      12/1990

(Continued)

OTHER PUBLICATIONS

Dr. Walter W.E. Hubner and Dip.-ing A. Schiltknecht, The Practical Anodising of Aluminum, 1960, MacDonald & Evans, 8 John Street, London, pp. 21-26.*

(Continued)

*Primary Examiner*—Roy King
*Assistant Examiner*—Jessee R. Roe
(74) *Attorney, Agent, or Firm*—Kenyon & Kenyon LLP

(57) ABSTRACT

A micromechanical component is described which includes a substrate; a monocrystalline layer, which is provided above the substrate and which has a membrane area; a cavity that is provided underneath the membrane area; and one or more porous areas, which are provided inside the monocrystalline layer and which have a doping that is higher than that of the surrounding layer.

10 Claims, 3 Drawing Sheets

U.S. PATENT DOCUMENTS

| | | | |
|---|---|---|---|
| 4,261,003 A * | 4/1981 | Magdo et al. | 257/526 |
| 4,340,899 A * | 7/1982 | Husimi et al. | 257/429 |
| 5,129,982 A * | 7/1992 | Wang et al. | 438/694 |
| 5,242,863 A * | 9/1993 | Xiang-Zheng et al. | 438/53 |
| 6,004,450 A | 12/1999 | Northrup et al. | |
| 6,359,276 B1 * | 3/2002 | Tu | 250/338.1 |
| 6,379,990 B1 * | 4/2002 | Muller et al. | 438/53 |

FOREIGN PATENT DOCUMENTS

| | | | |
|---|---|---|---|
| DE | 197 54 513 | | 6/1999 |
| JP | 06-302831 | * | 10/1994 |
| JP | 10-256362 | | 9/1998 |
| JP | 2000-150838 | | 5/2000 |
| WO | WO 98/29748 | * | 9/1998 |
| WO | WO 99 45583 | | 9/1999 |
| WO | WO 99/45583 | | 9/1999 |

OTHER PUBLICATIONS

Anderson, Rolfe C., Muller, Richard S., and Tobias, Charles W. "Porous Polycrystalline Silicon: A New Material for MEMS." Journal of Microelectromechanical Systems, vol. 3, No. 1, Mar. 1994, pp. 10-18.*

Meier, Daniel L., et al., "Contact Resistance: Its Measurement and Relative Importance to Power Loss in a Solar Cell", IEEE Transactions On Electron Devices, vol. ED-31, No. 5, May 1984, pp. 647-653.*

French, P. J. et al., "Epi-micromachining" Microelectronics Journal, Mackintosh Publications Ltd. Luton, GB, Bd. 28, Nr. 4, May 1, 1997, pp. 449-464.

Lammel, G. et al., "Free-standing, mobile 3D porous silicon microstructures" Sensors and Actuators A, Elsevier Sequoia S.A., Lausanne, CH, Bd. 85, Nr. 1-3, Aug. 25, 2000, pp. 356-360.

* cited by examiner

MICROMECHANICAL COMPONENT AND CORRESPONDING PRODUCTION METHOD

FIELD OF THE INVENTION

The present invention relates to a micromechanical component and a manufacturing method for producing it.

BACKGROUND INFORMATION

Membranes are usually manufactured by bulk or surface micromechanics. Bulk micromechanical designs have the disadvantage that they are relatively complex to manufacture and are therefore expensive. Surface micromechanical variants have the disadvantage that it is generally not possible to manufacture monocrystalline membranes.

Monocrystalline membranes have the advantage that the mechanical properties are more defined than in polycrystalline membranes. Moreover, it is possible to manufacture piezoresistive resistors having a significantly better long-term stability and higher piezoelectric coefficients using monocrystalline membranes than piezoresistive resistors in polycrystalline membranes.

SUMMARY OF THE INVENTION

The micromechanical component according to the present invention and the corresponding manufacturing method for producing the micromechanical component provide the advantage that a cavern having a superimposed monocrystalline membrane may be manufactured simply and cost-effectively using surface micromechanics. The monocrystalline membrane may be used, for example, for pressure sensors.

In accordance with the present invention, to manufacture the membrane, $n^+$- or $p^+$-doped areas are first selectively anodized (porous etching), which is carried out locally by means of a monocrystalline cover layer, e.g., an epitaxial layer. This is followed by a time-controlled switch to selective electropolishing of an $n^+$- or $p^+$-doped layer buried under the membrane. In this way, a cavity or a cavern is produced under the cover layer. Optionally, the porous $n^+$- or $p^+$-doped areas in the cover layer are finally sealed to enclose a defined gas pressure in the cavity produced.

Advantages of the present invention include simple integration into a semiconductor circuit process, consequently making it possible, for example, to integrate a membrane having an evaluation circuit on a chip (e.g., as a pressure sensor). In addition, little fluctuation due to underetchings occurs, i.e., it is possible to implement exactly specifiable dimensions. Moreover, simple sealing of the access openings is possible, if desired.

According to an exemplary embodiment, one or more sealing layers are provided above the monocrystalline layer to seal the porous areas.

According to another exemplary embodiment, the porous areas are sealed by oxidation. This is a particularly effective sealing method.

According to another exemplary embodiment, the monocrystalline layer and the porous areas are of the same doping type.

According to another exemplary embodiment, the monocrystalline layer and the porous areas are of different doping types.

According to another exemplary embodiment, the monocrystalline layer is provided by epitaxy.

According to another exemplary embodiment, the substrate is of a first conduction type and the buried layer is of a second conduction type. In the buried layer, one or more areas of the first conduction type are provided, which have higher doping than the substrate. This makes it possible to concentrate the lines of force during electropolishing and to avoid undesirable residues in the cavity.

DETAILED DESCRIPTION

Figure 1A:
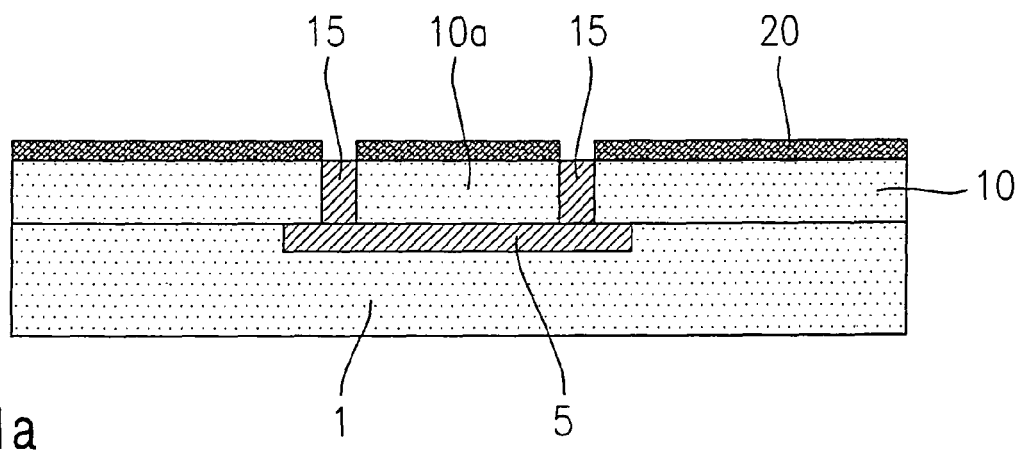
FIGS. 1a-1c show cross-sectional views illustrating different stages of the manufacturing process for a micromechanical component according to a first embodiment of the present invention.

Identical reference numerals in the figures denote identical components or components having an identical function.

Figure 1B:
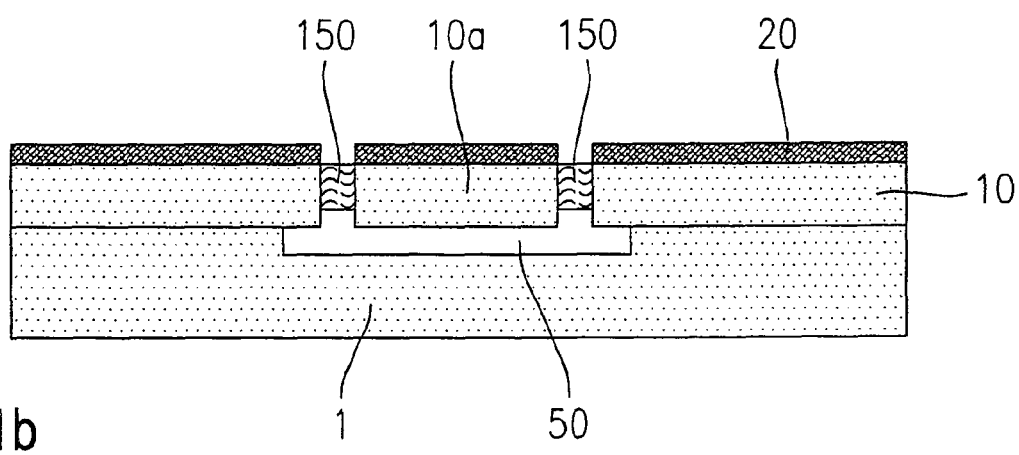
Figure 1C:
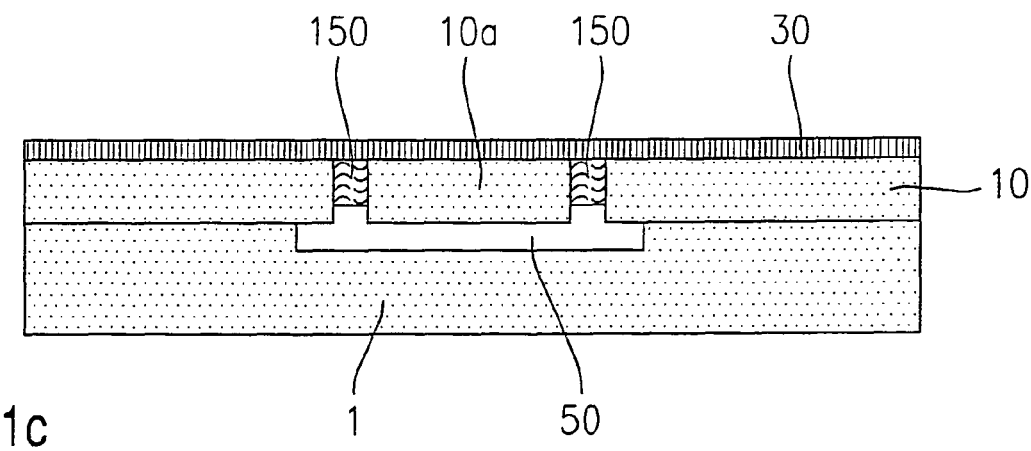

FIGS. 1a-1c show cross-sectional views illustrating different stages of the manufacturing process for a micromechanical component according to a first embodiment of the present invention.

In FIGS. 1a-1c, reference numeral 1 denotes a p-doped silicon substrate; 5 denotes a buried $n^+$-doped layer; 10 denotes an n-epitaxial layer; 15 denotes $n^+$-doped areas in n-epitaxial layer 10; 10a denotes a later membrane area; 20 denotes a mask; and 30 denotes a sealing layer of, e.g., metal, oxide, nitride, BPSG, etc.

According to FIG. 1a, buried $n^+$-doped layer 5 in p-silicon substrate 1 is produced under n-doped epitaxial layer 10 by standard process steps, e.g., by implantation. In addition, $n^+$-doping areas 15 are incorporated in epitaxial layer 10 at selected sites, e.g., at points or in the form of strips or rings, to produce $n^+$-doped connections from the surface to buried $n^+$-layer 5. Optionally, it is possible to deposit and structure a masking layer 20 or a plurality of such masking layers (e.g., of nitride) on epitaxial layer 1.

According to FIG. 1b, $n^+$-doping areas 15 may be converted into porous $n^+$-areas or entirely dissolved by electrochemical etching in solutions containing hydrofluoric acid ("anodization"), depending on the anodization conditions (hydrofluoric acid concentration, current density, etc.). The anodization rate is strongly dependent on the doping of the silicon. Low-doped n-silicon (n-epitaxial layer) is barely attacked while $n^+$-doped silicon is readily attacked. This selectivity is used to advantage in this embodiment.

In a first, time-controlled anodization step, n+-doped areas 15 in epitaxial layer 1 are etched to more or less complete porosity. The porosity is preferably greater than 50%. A change of the anodization conditions causes buried n+-doped layer 5 to be dissolved away when an etchant penetrates through the now porous areas 150 to the buried n+-doped layer 5. In the transitional area from n+-area 5 to p-doped substrate 1, there is a weakly n-doped area which acts as an anodization limit. The form of buried n+-doping 5 defines the area dissolved out.

According to FIG. 1c, porous areas 150 may—if desired—be closed very simply in a subsequent process step after removal of mask 20 because they have a nearly flat surface having very small holes. This is a significant advantage compared to standard micromechanical surface manufacturing methods in which holes usually having diameters greater than one μm must be sealed. The sealing may be performed, for example, by deposition of metal layer 30 or several layers (oxide, nitride, metal BPSG, ...) or by oxidation. The process pressure during deposition defines the internal gas pressure in cavity 50.

Figure 2A:
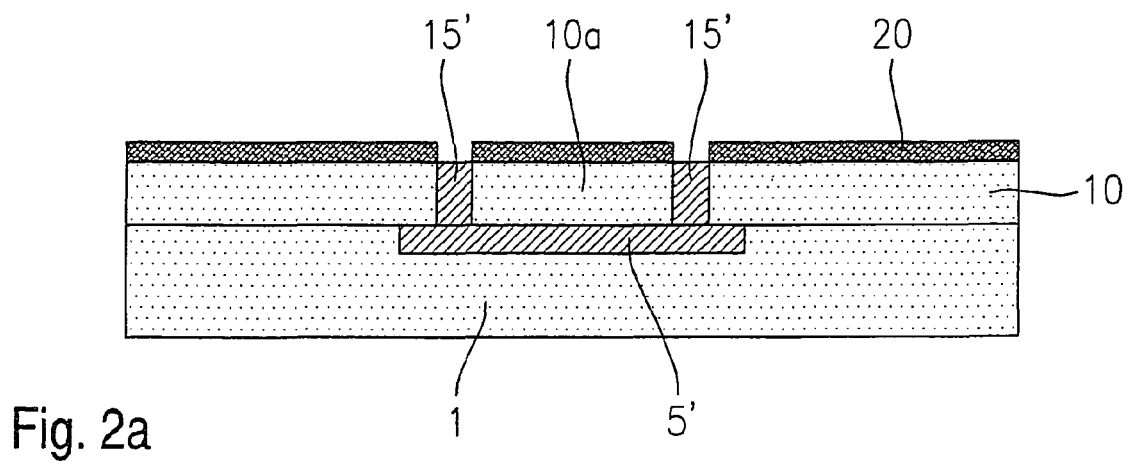
FIGS. 2a and 2b show cross-sectional views illustrating different stages of the manufacturing process for a micromechanical component according to a second embodiment of the present invention.
Figure 2B:
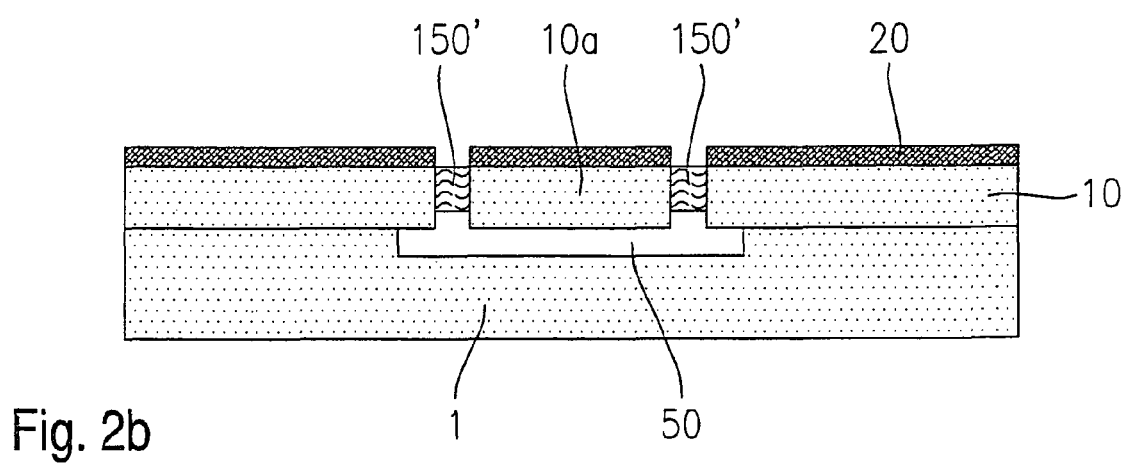

FIGS. 2a and 2b show cross-sectional views illustrating different stages of the manufacturing process for a micromechanical component according to a second embodiment of the present invention. The dopings used for the etched areas have been varied in this case.

In addition to the reference symbols already introduced in FIGS. 2a and 2b, 5' denotes a buried $p^+$-doped layer and 15' denotes $p^+$-doped feed-through areas.

In this example, a $p^+$-doping is incorporated in p-substrate 1 for buried layer 5'. In addition, n-epitaxial layer 10 is grown epitaxially over it and provided with $p^+$-feedthroughs 15'.

According to FIG. 2b, $p^+$-doped area 15' is selectively anodized to form porous $p^+$-doped area 150'. n-epitaxial layer 10 is not attacked in this case, and p-substrate 1 is attacked only slightly since the anodization rate of $p^+$ is significantly higher than that of p and n.

Figure 3:
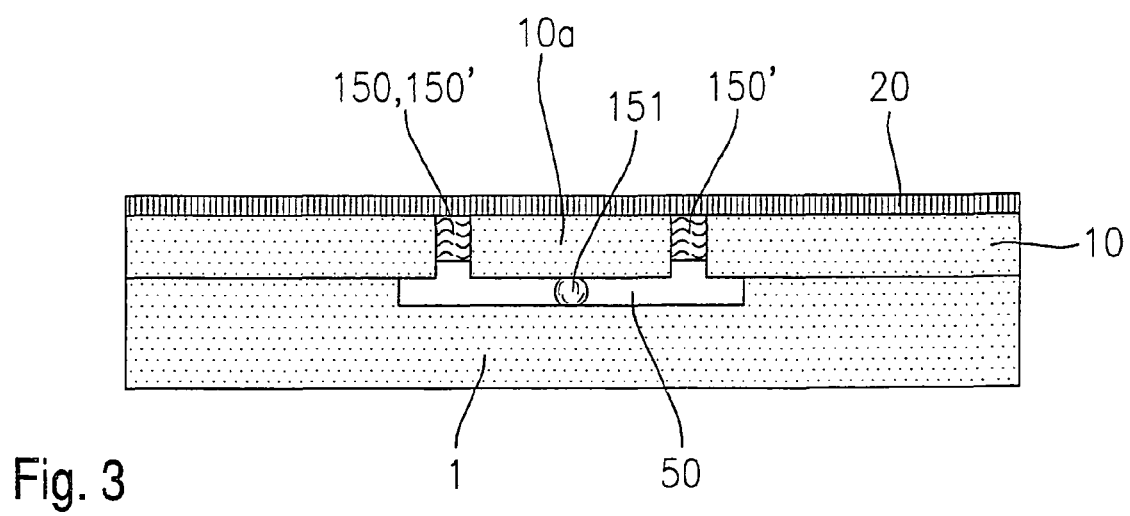
FIG. 3 shows a possible complication in manufacturing the micromechanical component according to the present invention.

FIG. 3 shows a possible complication in manufacturing the micromechanical component according to the present invention.

When the buried doping layer 5' is dissolved out via an etchant penetrating through the porous areas 150', there is the danger that a silicon web 151 will remain at the point at which two etch fronts meet. This web 151 could cause membrane 10a not to be completely freed, thus adversely affecting its function.

Figure 4A:
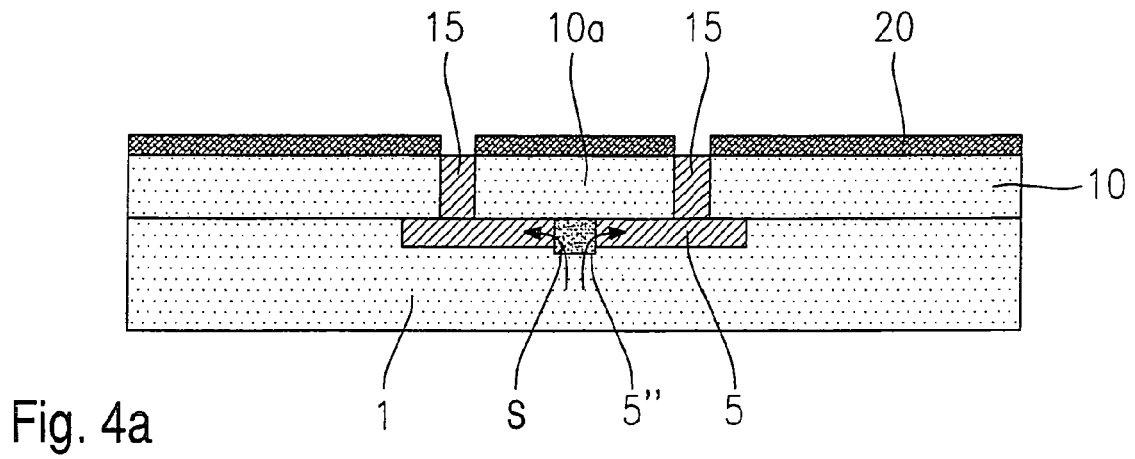
FIGS. 4a and 4b show cross-sectional views illustrating different stages of the manufacturing process for a micromechanical component according to a third embodiment of the present invention.
Figure 4B:
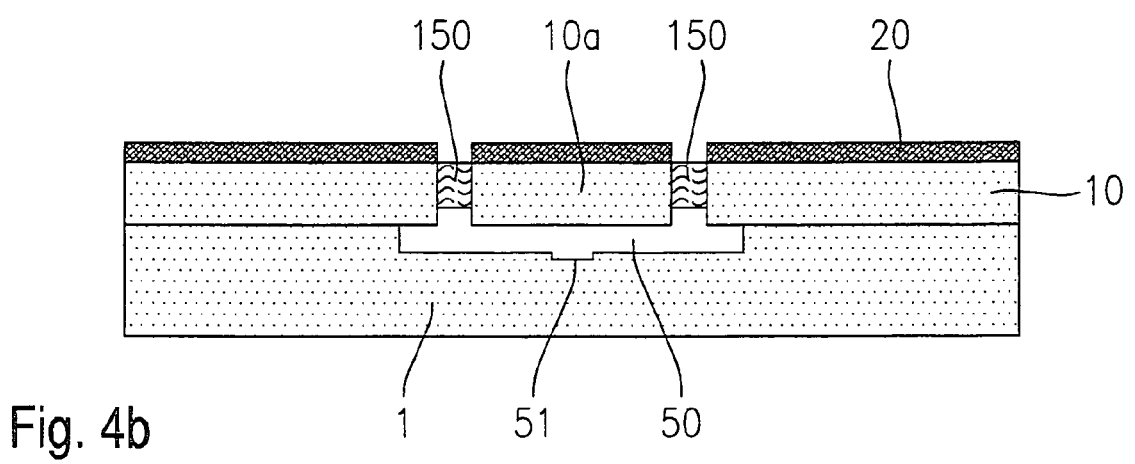

FIGS. 4a and 4b show cross-sectional views illustrating different stages of the manufacturing process for a micromechanical component according to a third embodiment of the present invention.

In the third embodiment, the danger described in connection with FIG. 3 may be confronted by providing a buried p+-doping area 5" in buried n+-layer 5 where the etch fronts meet during the subsequent anodization. This p+-doping area 5" causes lines of force S to be guided selectively during the subsequent anodization so that no web remains after the silicon is dissolved out via an etchant penetrating through the porous areas 150 to the buried n+-layer 5.

Although the present invention was described on the basis of exemplary embodiments, it is not limited to them but instead may be modified in various ways.

The described and illustrated embodiments are only exemplary of the manufacturing sequence. Optionally, additional dopings may be implemented next to the membrane or in the membrane, for example, to manufacture piezoresistors in the membrane and an evaluation circuit next to the membrane for an integrated pressure sensor. The buried $n^+$-doped layer and the $n^+$-doped feeds through the epitaxial layer may be designed in such a way that the buried layer is dissolved out through lateral $n^+$-etch channels, which are connected with the surface of the epitaxial layer at the channel end via the $n^+$-feeds.

What is claimed is:

1. A method of manufacturing a micromechanical component, comprising:
   providing a substrate;
   providing a buried layer on the surface of the substrate, the buried layer having higher doping concentration than the surrounding substrate;
   providing a monocrystalline layer above the substrate;
   providing inside the monocrystalline layer at least one area having higher doping concentration than the surrounding monocrystalline layer;
   selectively porous etching the at least one area having higher doping concentration to produce corresponding at least one porous area; and
   forming a permanent cavity under the monocrystalline layer and a membrane area above the permanent cavity by dissolving out the buried layer, wherein the dissolving out the buried layer to form the permanent cavity takes place entirely through the at least one porous area previously produced, by an electropolishing process in which an etchant is introduced, via penetration of the at least one porous area, to the area to be dissolved, wherein the at least one porous area is part of the membrane area above the permanent cavity.

2. The method as recited in claim 1, wherein at least one sealing layer is provided above the monocrystalline layer to seal the at least one porous area.

3. The method as recited in claim 1, wherein the at least one porous area is sealed by oxidation.

4. The method according to claim 1, wherein the monocrystalline layer and the at least one porous area are of the same doping type.

5. The method as recited in claim 1, wherein the monocrystalline layer and the at least one porous area are of different doping types.

6. The method as recited in claim 1, wherein the monocrystalline layer is provided by epitaxy.

7. The method as recited in claim 1, wherein the substrate has a first doping and at least a portion of the buried layer has a second doping different from that of the first doping, and wherein at least one area having the same doping as the substrate and a higher doping concentration than the substrate is provided in the buried layer.

8. The method as recited in claim 1, wherein the electropolishing process involves complete dissolution of material in the buried layer.

9. The method as recited in claim 8, wherein the dissolution of material in the buried layer is dependent on anodizing conditions.

10. A method of manufacturing a micromechanical component, comprising:
    providing a substrate;
    providing a buried layer on the surface of the substrate, the buried layer having higher doping concentration than the surrounding substrate;
    providing a monocrystalline layer above the substrate;
    providing inside the monocrystalline layer at least one area having higher doping concentration than the surrounding monocrystalline layer, wherein a thickness of the at least one area substantially extends across the entire thickness of the monocrystalline layer;
    selectively porous etching the at least one area having higher doping concentration to produce corresponding at least one porous area; and
    forming a permanent cavity under the monocrystalline layer and a membrane area above the permanent cavity by dissolving out the buried layer, wherein the dissolving out the buried layer to form the permanent cavity takes place entirely through the at least one porous area previously produced by introducing, via penetration of the at least one porous area, an etchant to the area to be dissolved, wherein the at least one porous area is positioned at a lateral edge of the membrane area above the permanent cavity.

* * * * *